US011114637B2

(12) United States Patent
Lee

(10) Patent No.: US 11,114,637 B2
(45) Date of Patent: Sep. 7, 2021

(54) CURRENT-DRIVEN DISPLAY AND METHOD FOR PRODUCING THE SAME

(71) Applicant: INT TECH CO., LTD., Hsinchu County (TW)

(72) Inventor: Shin-Shian Lee, Hsinchu (TW)

(73) Assignee: INT TECH CO., LTD., Hsinchu County (TW)

( * ) Notice: Subject to any disclaimer, the term of this patent is extended or adjusted under 35 U.S.C. 154(b) by 39 days.

(21) Appl. No.: 16/588,008

(22) Filed: Sep. 30, 2019

(65) Prior Publication Data

US 2020/0343473 A1      Oct. 29, 2020

(30) Foreign Application Priority Data

Apr. 25, 2019   (TW) .................................. 108114495

(51) Int. Cl.
*H01L 51/52*      (2006.01)
*H01L 27/32*      (2006.01)

(52) U.S. Cl.
CPC ...... *H01L 51/5225* (2013.01); *H01L 27/3225* (2013.01); *H01L 27/3246* (2013.01);
(Continued)

(58) Field of Classification Search
CPC ............. H01L 51/5225; H01L 27/3225; H01L 27/3246; H01L 27/3276; H01L 27/3211; H01L 2227/323
See application file for complete search history.

(56) References Cited

U.S. PATENT DOCUMENTS

2007/0236142 A1   10/2007   You
2012/0313123 A1*  12/2012   Kim ..................... H01L 51/525
                                                              257/89
(Continued)

FOREIGN PATENT DOCUMENTS

CN     103943663 A   7/2014
TW     200739992 A   10/2007
TW     I467755       1/2015

OTHER PUBLICATIONS

Office Action and Search Report dated Dec. 16, 2019 issued by Taiwan Intellectual Property Office for counterpart application No. 108114495.

(Continued)

*Primary Examiner* — Fernando L Toledo
*Assistant Examiner* — Neil R Prasad
(74) *Attorney, Agent, or Firm* — WPAT, P.C.; Anthony King

(57) ABSTRACT

The present disclosure provides a current-driven display, including a substrate and a first electrode layer stacked on the substrate in a stacking direction. The substrate includes a plurality of light-emitting units and a spacer separating each of the plurality of light-emitting units from one another. The first electrode layer includes a first region and a second region. The first region and the second region contact one of the plurality of light-emitting units, respectively, and are separated by the spacer. The current-driven display further includes a second electrode layer, which equipotentially connects the first region and the second region across the spacer. The present disclosure also provides a method for producing a current-driven display.

20 Claims, 17 Drawing Sheets

(52) U.S. Cl.
CPC ...... *H01L 27/3276* (2013.01); *H01L 27/3211* (2013.01); *H01L 2227/323* (2013.01)

(56) References Cited

U.S. PATENT DOCUMENTS

| | | | |
|---|---|---|---|
| 2015/0102319 A1* | 4/2015 | Jeon | H01L 27/288 257/40 |
| 2016/0284776 A1* | 9/2016 | Kim | H01L 51/0012 |
| 2019/0214601 A1* | 7/2019 | Park | H01L 51/5234 |
| 2019/0245011 A1* | 8/2019 | Lius | H01L 51/525 |

OTHER PUBLICATIONS

English Abstract Translation of Foreign Reference Document CN103943663A.

English Abstract Translation of Foreign Reference Document TWI467755.

US Patent Publication 20070236142 is the English counterpart application to Foreign Reference TW200739992.

* cited by examiner

CURRENT-DRIVEN DISPLAY AND METHOD FOR PRODUCING THE SAME

PRIORITY CLAIM AND CROSS REFERENCE

This application claims priority to Taiwan Patent Application Serial No. 108114495, filed on Apr. 25, 2019, which is incorporated by reference in its entirety.

TECHNICAL FIELD

The present disclosure relates generally to a display; specifically, the present disclosure relates to a current-driven display and a method for producing the same.

BACKGROUND

One of the goals in the field of current-driven displays is to reduce the area of the upper electrode layer as much as possible while still capable of providing the current loop, so as to reduce the chances that the upper electrode layer reflects the ambient light. Accordingly, there exists an urgent need to provide a technology of patterning the upper electrode layer to produce an upper electrode layer, which comprises a plurality of electrode layer regions that equipotentially connecting each pixel and having an area respectively corresponding to each pixel.

BRIEF SUMMARY OF TIRE INVENTION

In order to address the issues existing in the related art, the present inventor has put forward a proper inventive concept, which can be implemented by many different embodiments as described below.

One embodiment of the present disclosure is a current-driven display, comprising a substrate and a first electrode layer stacked on the substrate in a stacking direction. The substrate comprises a plurality of light-emitting units and a spacer separating each of the plurality of light-emitting units from one another. The first electrode layer comprises a first region and a second region. The first region and the second region contact one of the plurality of light-emitting units, respectively, and are separated by the spacer. The current-driven display further comprises a second electrode layer, which equipotentially connects the first region and the second region across the spacer.

In some embodiments, the first electrode layer includes a first overlapping area and a first non-overlapping area, and the second electrode layer comprises a second overlapping area and a second non-overlapping area; wherein the first overlapping area overlaps with the second overlapping area.

In some embodiments, in a horizontal direction perpendicular to the stacking direction, the first overlapping area is at least adjacent to the first non-overlapping area or the second non-overlapping area.

In some embodiments, in a horizontal direction perpendicular to the stacking direction, the first non-overlapping area is adjacent to the second non-overlapping area.

In some embodiments, the substrate comprises a non-patterned area that is not covered by the plurality of light-emitting units, the spacer; the first electrode layer, and the second electrode layer.

In some embodiments, in a horizontal direction perpendicular to the stacking direction, the non-patterned area is adjacent to at least one of the first overlapping area, the first non-overlapping area and the second non-overlapping area.

In some embodiments, the current-driven display further includes a sensor, located in the non-patterned area.

In some embodiments, the current-driven display further includes a third electrode layer; at least equipotentially connected with the first electrode layer or the second electrode layer, directly or indirectly.

In some embodiments, the current-driven display further includes an insulating material, located between any two of the first electrode layer, the second electrode layer, and the third electrode layer.

In some embodiments, the third electrode layer partially contacts the spacer.

In some embodiments; the second electrode layer comprises a plurality of third regions. In a horizontal direction perpendicular to the stacking direction, and the spacer is located between any two of the plurality of third regions.

In some embodiments, the first region and the second region are in a strip shape extending in a first direction and discontinuous in a second direction; wherein the plurality of third regions are in a strip shape extending in the second direction and discontinuous in the first direction; and wherein the first direction and the second direction are perpendicular to the stacking direction.

In some embodiments, at least one of the first electrode layer and the second electrode layer is a composite structure made of two or more materials.

In some embodiments; the current-driven display further includes a lower electrode, located between the first electrode layer and the substrate or between the substrate and the second electrode layer.

In some embodiments, the spacer covers a periphery of the lower electrode.

In some embodiments, the first electrode layer partially contacts the spacer.

Another embodiment of the present disclosure is a method for producing a current-driven display; which comprises providing a substrate. The substrate comprises a plurality of light-emitting units and a spacer separating each of the plurality of light-emitting units from one another. The method further comprises depositing a first electrode layer on the substrate in a stacking direction. The first electrode layer comprises a first region and a second region. The first region and the second region contact one of the plurality of light-emitting units; respectively, and are separated by the spacer. The method further comprises depositing a second electrode layer on the substrate in the stacking direction. The second electrode layer equipotentially connects the first region and the second region across the spacer.

In some embodiments, the method further includes partially overlapping the first electrode layer with the second electrode layer to form an overlapping area.

In some embodiments, the method further includes forming a non-patterned area on the substrate, wherein the non-patterned area is not covered by the plurality of light-emitting units, the spacer, the first electrode layer, and the second electrode layer.

In some embodiments, the method further includes arranging a sensor on the non-patterned area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
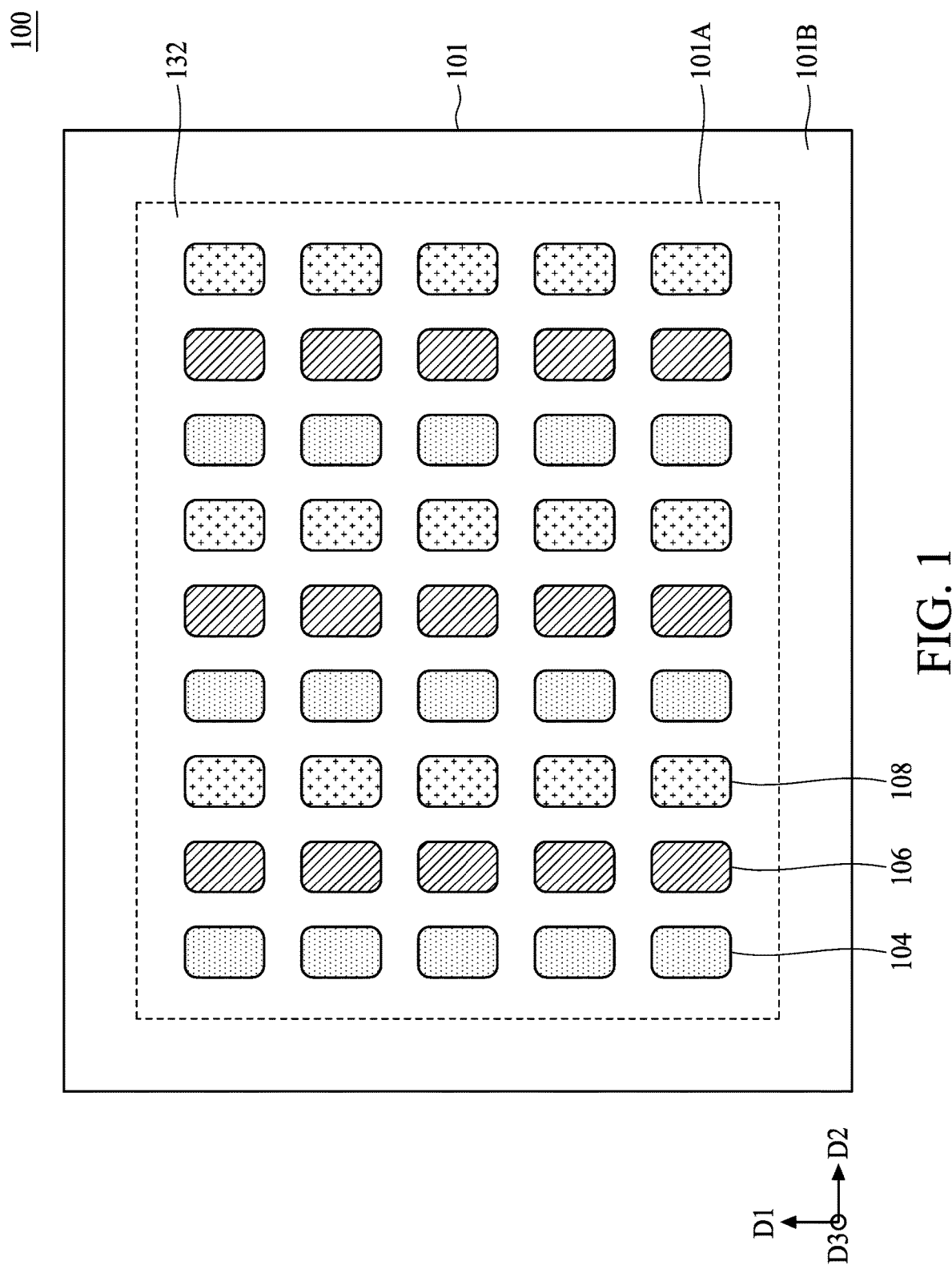
FIG. 1 is a top view of an exemplary current-driven display according to one embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1; FIG. 1 is a top view of an exemplary current-driven display 100 according to one embodiment of the present disclosure.

The current-driven display 100 comprises a substrate 101, wherein the substrate 101 comprises thereon a plurality of light-emitting units and a spacer 132 separating each of the light-emitting units from one another.

In some embodiments, the substrate 101 comprises a display area 101A and a non-display area 101B, wherein the display area 101A comprises a plurality of light-emitting units, configured to display images. The non-display area 101B does not comprise the light-emitting unit and is located in a periphery of the display area 101A. In some embodiments, the non-display area 101B adjoins the periphery or one side of the display area 101A. The non-display area 101B is also known as the non-emitting area, which is configured to accommodate the power supply, serves as the folding area, or accommodate other components.

In some embodiments, the plurality of light-emitting units are arranged in an array on the display area 101A. In some embodiments, the plurality of light-emitting units are arranged in a first direction D1 and a second direction D2, wherein the first direction D1 and the direction D2 are perpendicular to each other, as shown in FIG. 1; however, the present disclosure is not limited thereto. In some embodiments, the array of the light-emitting units may be arranged in other configurations.

In some embodiments, the plurality of light-emitting units may comprise a first light-emitting unit 104, a second light-emitting unit 106, and a third light-emitting unit 108. In the specification and drawings of the present disclosure, light-emitting units 104, 106, and 108 are used as representatives to described in details the light-emitting units of any numbers in the light-emitting units. The light-emitting units 104, 106, and 108 emit lights of different wavelengths, respectively. For example, the first light-emitting unit 104 emits red light, the second light-emitting unit 106 emits blue light, and the third light-emitting unit 108 emits green light; however, the present disclosure is not limited thereto.

In some embodiments, the light-emitting units 104, 106, and 108 form a row of light-emitting units in the first direction D1 and stagger with one another in the second direction D2, as shown in FIG. 1. In some embodiments, light-emitting units emitting light of the same wavelength form a row of light-emitting units in the second direction D2 and stagger with one another in the first direction D1. In some embodiments, light-emitting units emitting light of two different wavelengths form a row of light-emitting units in the first direction D1 emitting units and stagger with one another in the second direction D2.

The above description and accompanying drawings regarding the light-emitting units are provided for illustrative purposes only, and the present disclosure is not limited thereto. Persons having ordinary skill in the art should understand that the arrangement of light-emitting units, the wavelength of the emitted light, etc. may be adjusted according to the actual needs.

In some embodiments, the substrate 101 is disposed under the light-emitting units in a third direction D3 (the stacking direction). In some embodiments, the substrate 101 may comprise an insulating substrate. In some embodiments, the substrate 101 is flexible. In some embodiments, the substrate 101 may comprise a transparent glass that is made mainly of silicon dioxide (SiO$_2$). In some embodiments, the substrate 101 may comprise a non-transparent material or a plastic material.

In some embodiments, the substrate 101 may comprise a thin-film transistor (TFT) array layer, which comprises a plurality of TFTs arranged correspondingly to each light-emitting unit. Each TFT is electrically connected to a lower electrode 130 (discussed below with reference to FIG. 3) and comprises an active region, wherein the active region comprises polycrystalline silicon, monocrystalline silicon, amorphous silicon, or other suitable materials. In some embodiments, the substrate 101 may comprise a plurality of capacitors.

In some embodiments, the substrate 101 is a laminate comprising at least three different layers. For example, the substrate 101 may be a laminate formed from the following layers: an inorganic dielectric material layer, organic dielectric material layer, metallic material layer, polymeric material layer, polymeric material layer coated with inorganic material, etc. In some embodiments, the substrate 101 may comprise a black material for absorbing the visible light, thereby reducing the reflection.

In some embodiments, the spacer 132 is disposed on the substrate 101 and has a plurality of openings for defining the positions of the light-emitting units on the substrate 101, wherein the exposed area of the light-emitting units from each opening is referred to as the effective light-emitting area or the pixel. Persons having ordinary skill in the art should understand that the spacer 132 is also known as a pixel-defining layer (PDL).

In some embodiments, the spacer 132 comprises an organic material, such as polyimide (PI), polyamide (PA), acrylic resin, phenolic resin, and benzocyclobutene (BCB). In some embodiments, the spacer 132 comprises an inorganic material, such as silicon nitride. In some embodiments, the spacer 132 comprises the black material.

Figure 2A:
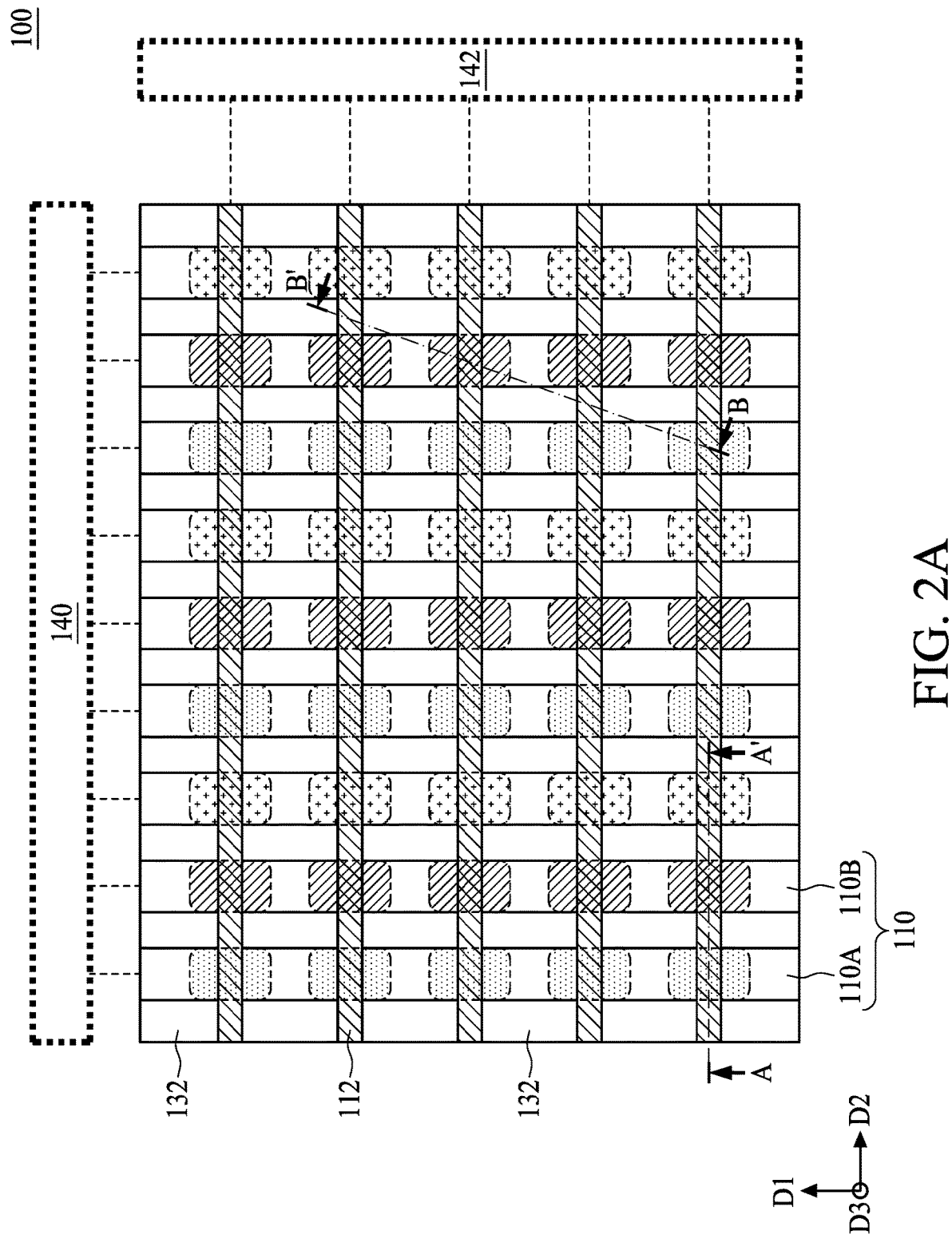
FIG. 2A to FIG. 2D are top views of an exemplary current-driven display according to one embodiment of the present disclosure.

Referring to FIG. 2A; FIG. 2A is a top view of an exemplary current-driven display 100 according to one embodiment of the present disclosure. For the sake of brevity, the labels of the display area 101A and the non-display area 101B are omitted in FIG. 2A, and the electrodes 110, 112 and power supplies 140, 142 are further illustrated.

The upper electrode comprises the first electrode layer 110 and the second electrode layer 112. The first electrode layer 110 is stacked on the substrate 101 in the third direction D3. The first electrode layer 110 comprises a plurality of regions that are discontinuous and separated from one another by the spacer 132. The second electrode layer 112 equipotentially connects the discontinuous regions across the spacer 132. In some embodiments, the second electrode layer 112 contacts the discontinuous regions across the spacer 132.

Still referring to FIG. 2A, in some embodiments, as a whole, the first electrode layer 110 contacts the effective light-emitting areas of at least two light-emitting units. In some embodiments, the first electrode layer 110 covers the effective light-emitting areas of at least two light-emitting units. In some embodiments, the first electrode layer 110 covers a portion of the spacer 132. In some embodiments, the first electrode layer 110 partially contacts the spacer 132.

In some embodiments, the first electrode layer 110 comprises a first region 110A and a second region 110B. The first region 110A and the second region 110B contact the light-emitting units 104 and 106, respectively (as shown in FIG. 1), and are separated from each other by the spacer 132. The second electrode layer 112 equipotentially connects the first region 101A and the second region 110B across the spacer 132.

In some embodiments, it is feasible to reduce the size of the second electrode layer 112 as much as possible while still capable of providing the current so as to reduce the chances of the reflection of ambient light. In some embodiments, the first electrode layer 110 located on the effective light-emitting areas are not fully covered by the second electrode layer 112. In some embodiments, the fully overlapping area of the second electrode layer 112 and the first electrode layer 110 is smaller than the total area of the light-emitting units.

In some embodiments, the second electrode layer 112 comprises a plurality of third regions, wherein the spacer 132 is located in any two of the plurality of third regions in a horizontal direction perpendicular to a third direction D3. As shown in FIG. 2A, a plurality of third regions is separated from one another in the first direction D1 and the spacer 132 is disposed between any two third regions.

In some embodiments, the first electrode layer 110 comprises a plurality of strip regions. For example, the first region 110A and the second region 110B are in a strip shape extending in the first direction D1 and discontinuous in the second direction D2. In some embodiments, the second electrode layer 112 comprises a plurality of strip regions. For example, the third region is in a strip shape extending in the second direction D2 and discontinuous in the first direction D1.

In some embodiments, the current-driven display 100 further comprises a power supply. In some embodiments, the current-driven display 100 comprises a power supply 140 connected to the first electrode layer 110. In some embodiments, the current-driven display 100 comprises a power supply 142 connected to the second electrode layer 112. The power supply 140 or the power supply 142 is connected to the light-emitting units via the first electrode layer 110 or the second electrode layer 112, thereby forming part of the loop.

In the case where the first electrode layer 110 is connected to the power supply 140 whereas the second electrode layer 112 is not connected to the power supply, the first electrode layer 110 can be considered to equipotentially connect the second electrode layer 112. In the present disclosure, equipotential connection refers to the connection of two discontinuous electrode regions using a conductive material, no matter whether the conductive material is connected to a power supply.

In some embodiments, the first electrode layer 110 and the second electrode layer 112 are cathodes of the current-driven display 100. In some embodiments, the first electrode layer 110 and/or the second electrode layer 112 may be a transparent electrode, reflective electrode, or transflective electrode. In some embodiments, the first electrode layer 110 and/or the second electrode layer 112 may be a composite structure made of two or more materials. In some embodiments, the first electrode layer 110 and/or the second electrode layer 112 comprises a conductive thin film and a transparent conductive thin film. In some embodiments, the conductive thin film is disposed between the light-emitting units and the transparent conductive thin film thereof. In some embodiments, the transparent conductive thin film is disposed between the light-emitting units and the conductive thin film thereof. In some embodiments, the conductive thin film comprises aluminum (Al), gold (Au), silver (Ag), copper (Cu), magnesium (Mg), molybdenum (Mo), platinum (Pt), palladium (Pd), nickel (Ni), niobium (Nd), tantalum (Ir), chrome (Cr), or compounds of above-mentioned metals. In some embodiments, the transparent conductive thin film comprises indium (In), tin (Sb), graphene, zinc (Zn), oxygen (O), indium tin oxide (ITO), indium zinc oxide (IZO), zinc oxide (ZnO), or indium oxide (In$_2$O$_3$), etc. In some embodiments, the first electrode layer 110 and the second electrode layer 112 has a total thickness of 1500 angstroms to 2700 angstroms.

Although electrode layer regions of specific numbers are disclosed in the present specification and drawings, the present disclosure is not limited thereto; for example, the first electrode layer may comprise any number of regions, and a second electrode layer may also comprise any number of regions.

Figure 2B:
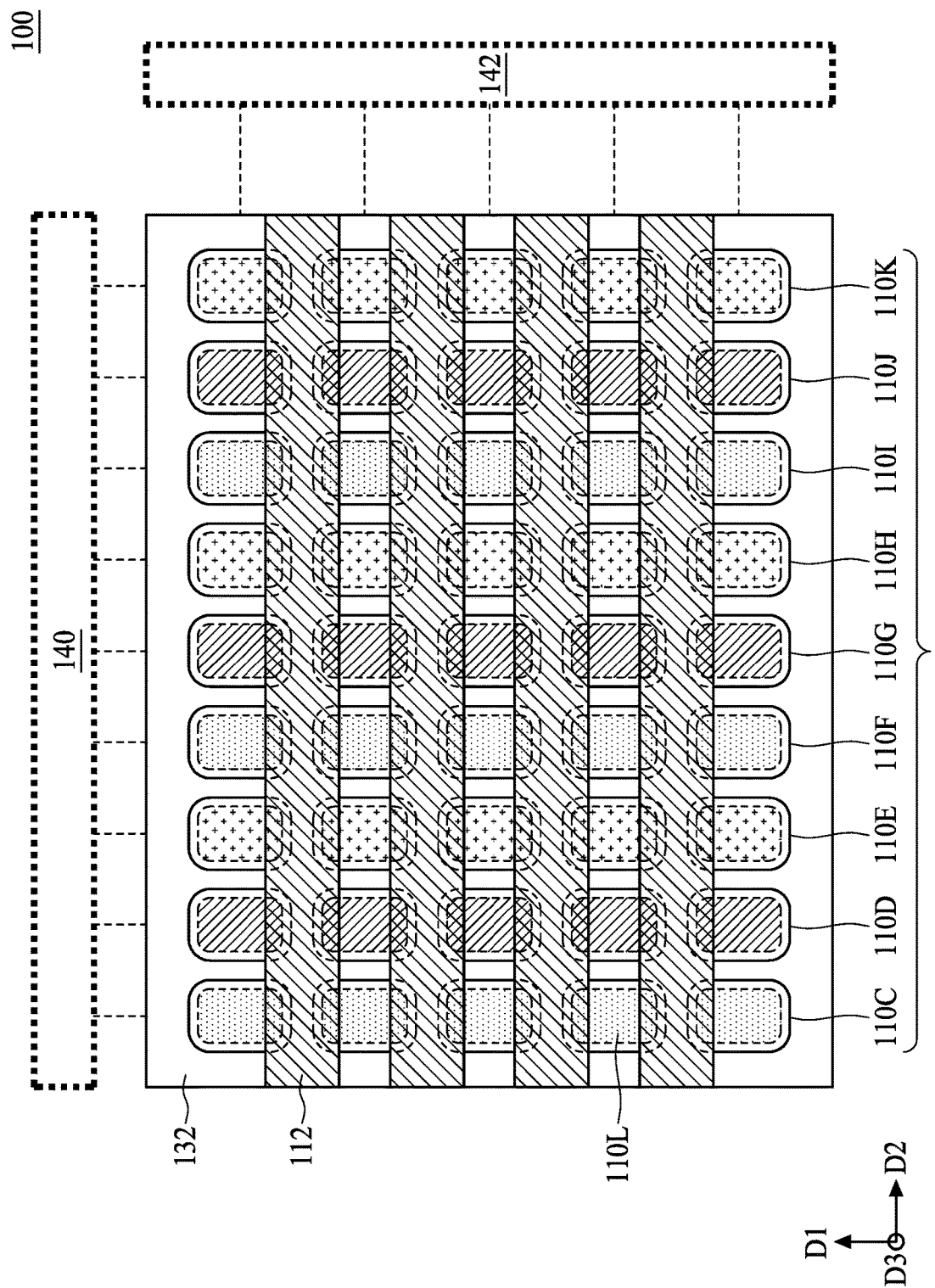

The first electrode layer 110 may comprise a region of another shape; as shown in FIG. 2B, in some embodiments, the first electrode layer 110 may comprise regions 110C-110K. In some embodiments, regions 110C-110K corresponds to the effective light-emitting area of the light-emitting units and the two are aligned substantially in a third direction D3. In some embodiments, each region is discontinuous in both the first direction D1 and the direction D2; for example, the region 110C is discontinuous with both of the adjacent regions 110L and 110D. In some embodiments, the area of each region is greater than the effective light-emitting area of each light-emitting unit. In some embodiments, in the second direction D2, the width of the first electrode layer 110 is greater than the effective light-emitting area of the corresponding light-emitting unit.

Still referring to FIG. 2B, in some embodiments, the second electrode layer 112 illustrated in FIG. 2B is similar to the second electrode layer 112 illustrated in FIG. 2A in that both of them has a strip discontinuous in the second direction D2. The two differ in that the second electrode layer 112 of the FIG. 2B equipotentially connects the first electrode layer regions discontinuous in the first direction D1.

Figure 2C:
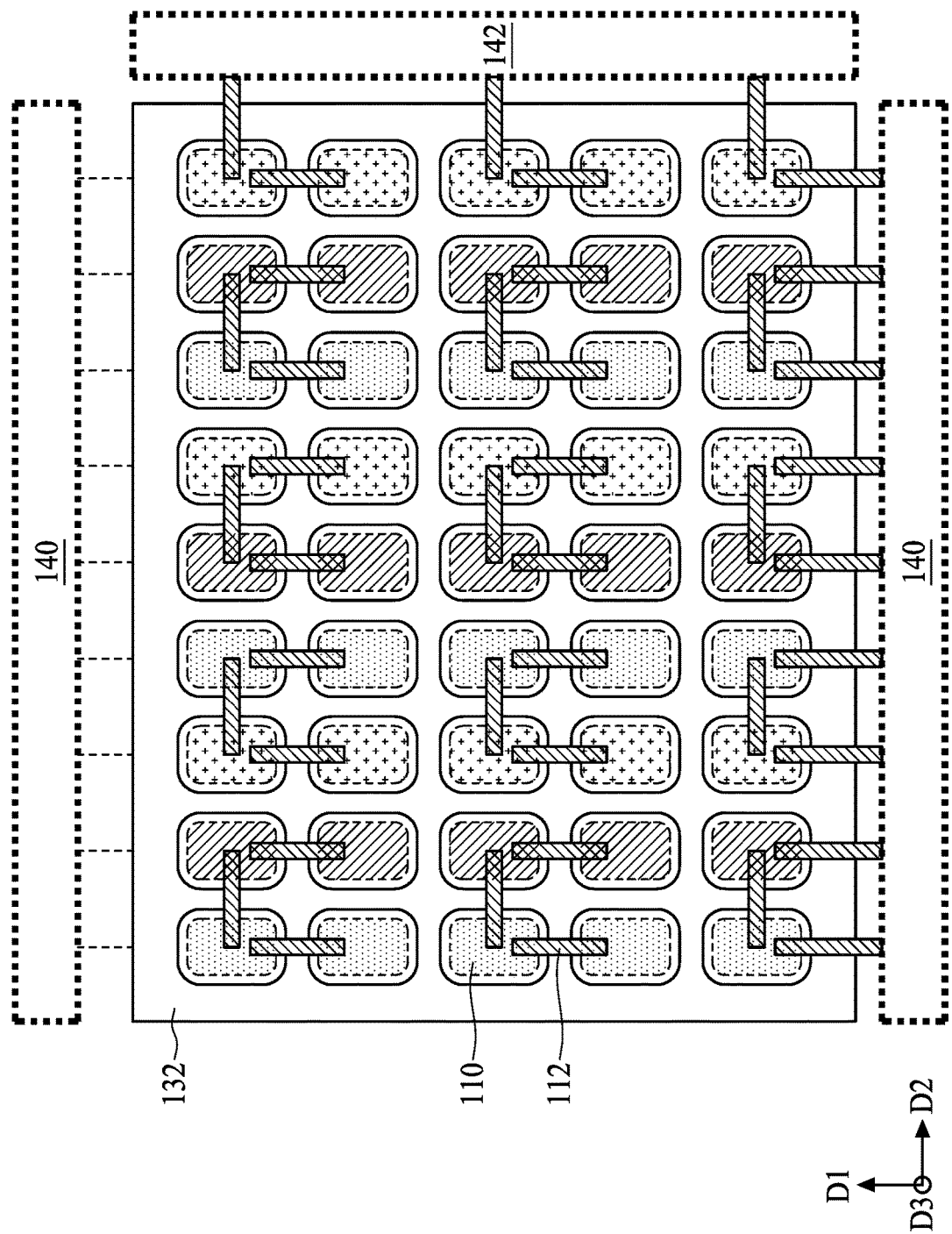

Referring to FIG. 2C, in some embodiments, the current-driven display 100 in FIG. 2C comprises a first electrode layer 110 that is the same as that illustrated in FIG. 2B, wherein the first electrode layer 110 comprises a plurality of first electrode layer regions that are discontinuous both in the first direction D1 and the direction D2. Moreover, the current-driven display 100 in FIG. 2C comprises a second electrode layer 112 equipotentially connecting the first electrode layer 110.

The second electrode layer 112 comprises a plurality of second electrode layer regions, wherein a portion thereof extends in the X direction and a portion thereof extends in the Y direction. Any second electrode layer region equipotentially connects two first electrode layer regions or connects one first electrode layer region with the power supply.

In some embodiments, the spacer 132 is located between any two of the plurality of second electrode layer regions in a horizontal direction perpendicular to the stacking direction (the third direction D3).

In some embodiments, it is feasible to reduce the size of the second electrode layer 112 as much as possible while still capable of providing the current so as to reduce the chances of the reflection of ambient light. In some embodiments, the first electrode layer 110 is not fully covered by the second electrode layer 112. In some embodiments, the fully overlapping area of the second electrode layer 112 and the first electrode layer 110 is smaller than the area of the light-emitting area.

In some embodiments, the current-driven display 100 in FIG. 2C also comprises a strip feature continuous in the first direction D1, just like the first electrode layer 110 in FIG. 2A; and comprises the second electrode layer 112 as shown in FIG. 2C, in which any second electrode layer region equipotentially connects two strip features discontinuous in the first direction D1 or second direction D2, or connects one strip feature with the power supply. In this embodiment, all second electrode layer regions extend in the second direction D2.

Figure 2D:
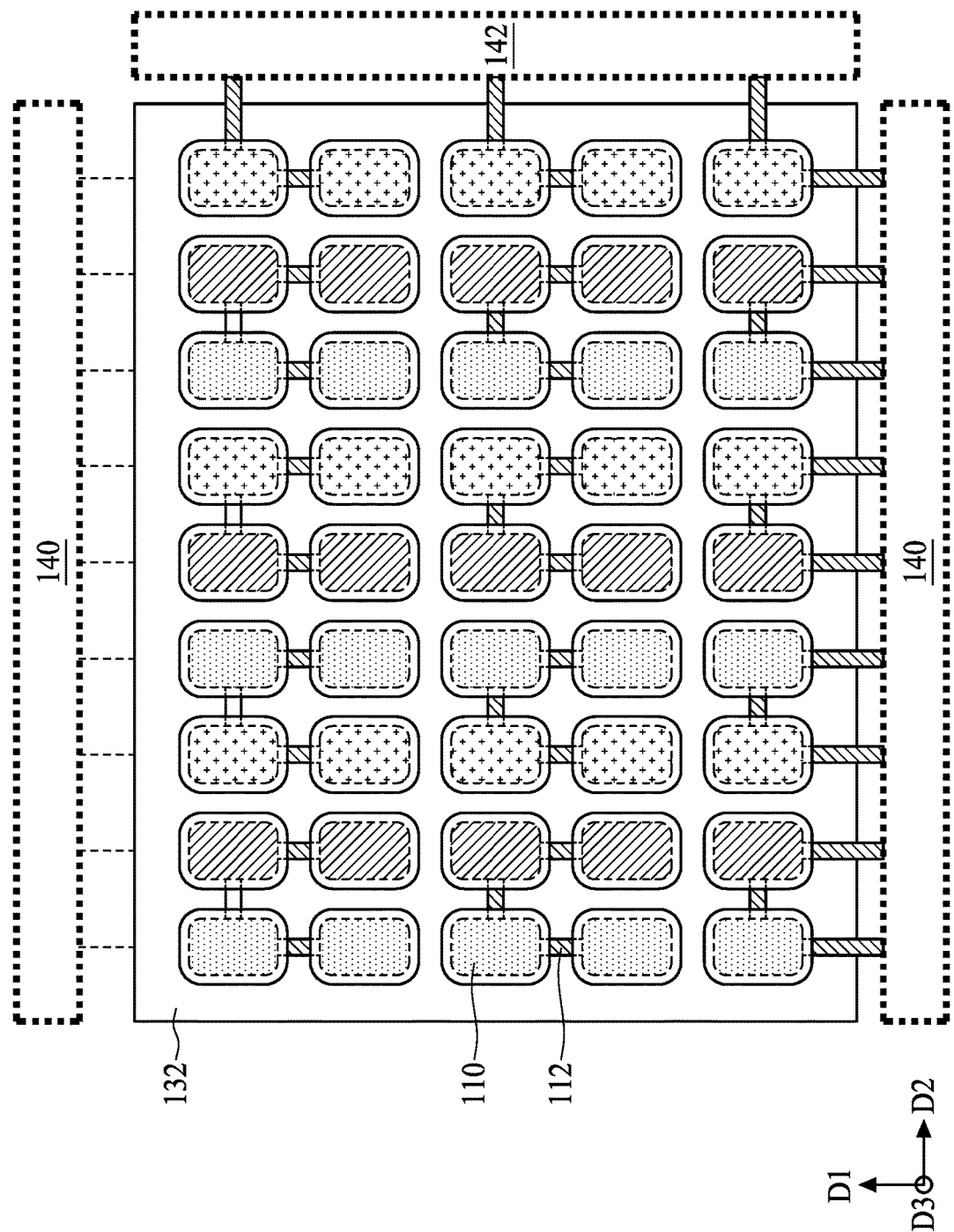

Referring to FIG. 2D, in some embodiments, the current-driven display 100 in FIG. 2D comprises a first electrode layer 110 and a second electrode layer 112 that are the same as those in the current-driven display 100 in FIG. 2C, with the exception to the relative position in the third direction D3. In FIG. 2D, a portion of the second electrode layer 112 is disposed between the first electrode layer 110 and the light-emitting units.

Figure 3:
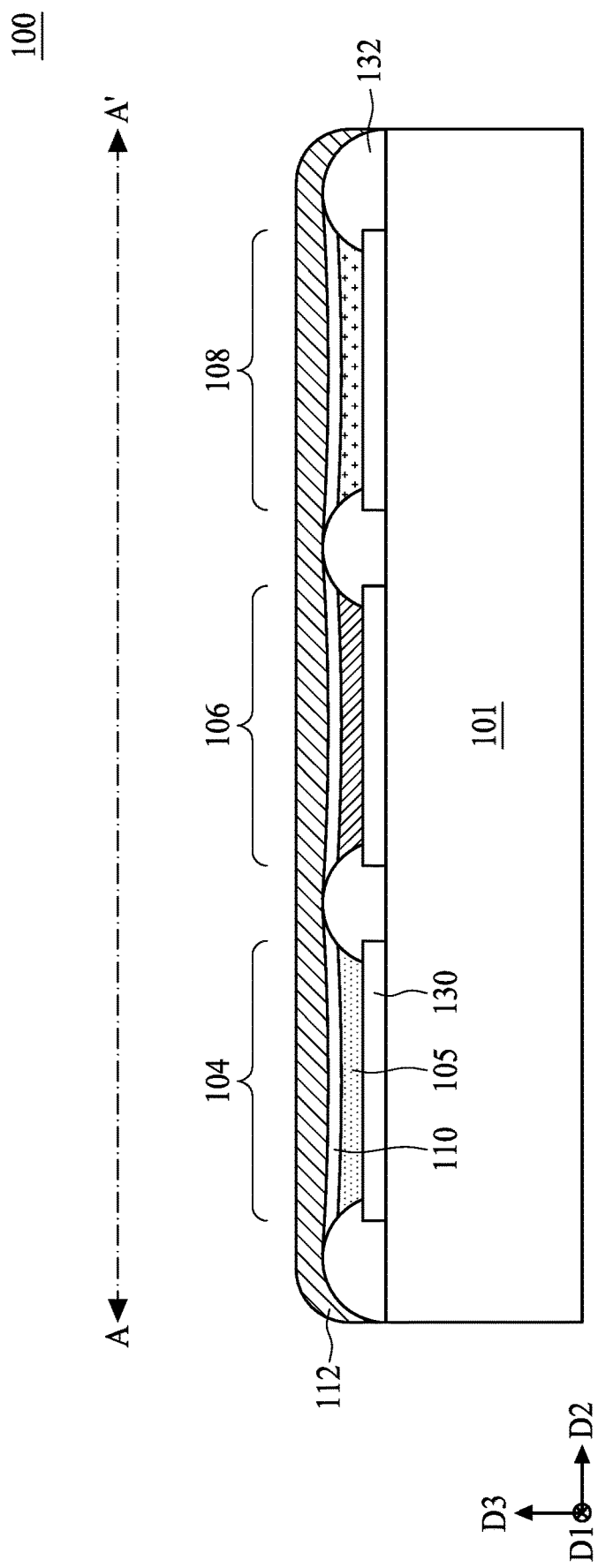
FIG. 3 is a cross-sectional view illustrating a portion taken along line AA' in FIG. 1.

Referring to FIG. 3, which is a cross-sectional view of the portion taken along line AA' in FIG. 1. As shown in FIG. 3, in some embodiments, each light-emitting unit comprises an organic light-emitting layer 105 and a lower electrode 130. In some embodiments, when being viewed from the third direction D3, the organic light-emitting layer 105 partially covers the spacer 132. In some embodiments, the lower electrode is the anode of the current-driven display 100. In the present disclosure, the area where the organic light-emitting layer overlaps with the lower electrode forms the effective light-emitting area of the light-emitting units; the light-emitting units illustrative in FIG. 1 represent the effective light-emitting area, wherein the effective light-emitting area is not covered by the spacer 132.

In some embodiments, the components (e.g., capacitors, TFTs, etc.), lower electrode 130, and light-emitting units 104, 106, 108 in the substrate 101 forms a loop, wherein the loop is connected with the power supply 140 and 142 via the upper electrodes 110 and 112.

In some embodiments, the spacer 132 has an array of bumps, which comprises a plurality of bumps, such as the bumps shown in FIG. 3, wherein the gaps between the bumps are configured to accommodate the light-emitting units. Persons having ordinary skill in the art should understand that although the bumps illustrated in the cross-sectional view of FIG. 3 are separated from each other, but in fact, the bumps are connected with one another somewhere else, thereby forming the integral spacer 132 as shown in the top view of FIG. 1, which has a plurality of gaps having the pattern defining the light-emitting units.

In some embodiments, the lower electrode 130 is located at the upper surface of the substrate 101 and between the light-emitting units 105 and the substrate 101. In some embodiments, the lower electrode 130 is located between the substrate 101 and the first electrode layer 110. In some embodiments, the lower electrode 130 is located between the substrate 101 and the second electrode layer 112.

In some embodiments, in the third direction D3, the lower electrode 130 is partially covered by the spacer 132. In some embodiments, a periphery of the lower electrode 130 is covered by the spacer 132. In some embodiments, the sidewall of the lower electrode 130 is in contact with the spacer 132. In some embodiments, in the third direction D3, the lower electrode 130 has a total thickness of 1500 angstrom to and 2700 angstrom. In some embodiments, the lower electrode 130 has a total thickness of 1800 angstrom to and 2200 angstrom. In some embodiments, the lower electrode 130 has a total thickness of about 2000 angstrom.

In some embodiments, like the upper electrodes 110, 112, the lower electrode 130 may be a transparent electrode, a reflective electrode, or a transflective electrode.

In some embodiments, when being applied with sufficient voltage, the holes from the lower electrode 130 and the electrons from the upper electrodes 110, 112 are combined to form excitons in the organic light-emitting layer, wherein the excitons release energy when returning to the ground state from the excited state, and part of the energy is released as the light energy in the organic light-emitting layer.

In some embodiments, each light-emitting unit further comprises a hole injection layer (HIL) and a hole transporting layer (HTL). In some embodiments, the hole injection layer and the hole transporting layer are located between the lower electrode 130 and the organic light-emitting layer 105.

In some embodiments, each light-emitting unit further comprises an electron injection layer (EIL) and an electron transporting layer (ETL); the electron injection layer and the electron transporting layer are located between the organic light-emitting layer 105 and the upper electrodes 110, 112.

Figure 4:
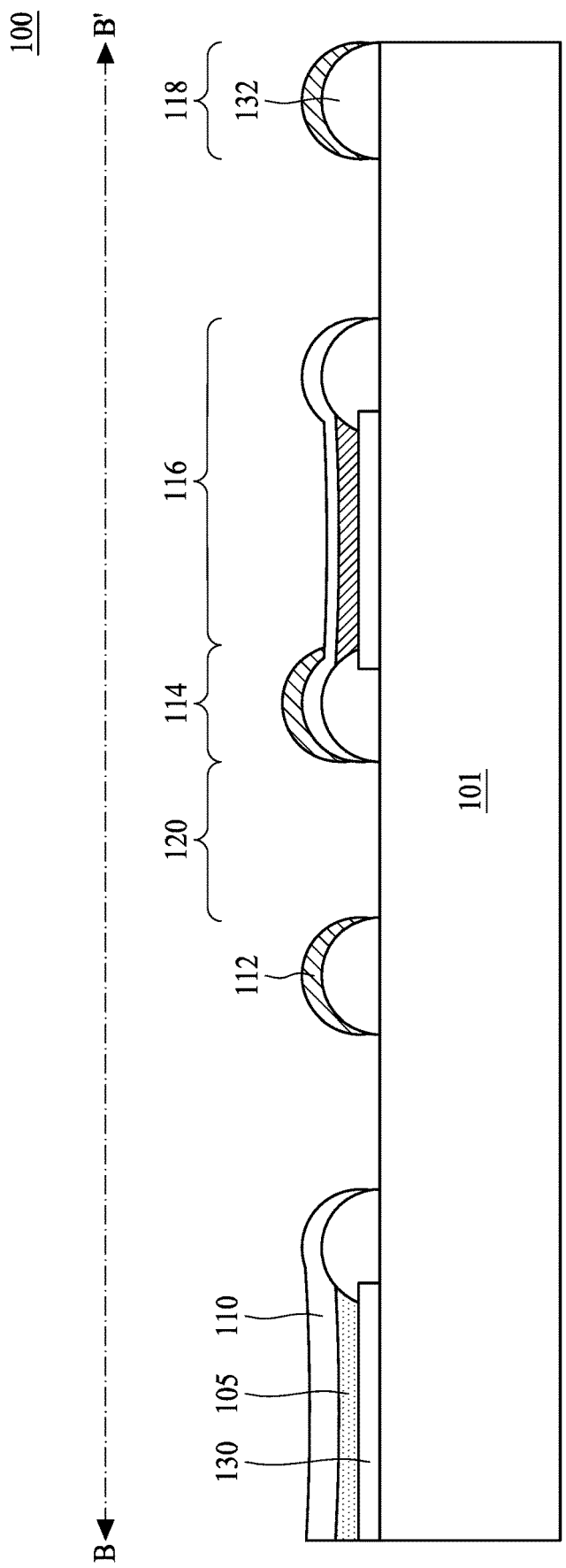
FIG. 4 is a cross-sectional view illustrating a portion taken along line BB' in FIG. 1.

Referring to FIG. 4, which is a cross-sectional view of the portion taken along line BB' in FIG. 1. As shown in FIG. 4, the first electrode layer 110 comprises an overlapping area 114 and a first non-overlapping area 116. The second electrode layer 112 comprises an overlapping area 114 and a non-overlapping area 118. The area where the first electrode layer 110 overlaps with the second electrode layer 112 is the overlapping area 114.

In the present disclosure, the first non-overlapping area 116 refers to the area that covers only the first electrode layer 110. The second non-overlapping area 118 refers to the area that covers only the second electrode layer 112.

Still referring to FIG. 4, the substrate 101 further comprises a non-patterned area 120. In the present disclosure, the non-patterned area 120 refers to the area in the display area 101A on the substrate 101 that is not covered by the light-emitting units, the spacer 132, the first electrode layer 110, and the second electrode layer 112.

In some embodiments, in a horizontal direction perpendicular to the third direction D3, the overlapping area 114 is adjacent to the first non-overlapping area 116. As shown in FIG. 4, the first non-overlapping area 116 is partially covered by the second electrode layer 112. In some embodiments, the overlapping area 114 is also adjacent to the non-overlapping area 118. For example, the second electrode layer 112 is partially covered by the first non-overlapping area 116. In some embodiments, the overlapping area 114 is adjacent to at least the first non-overlapping area 116 or the second non-overlapping area 118.

Figure 7:
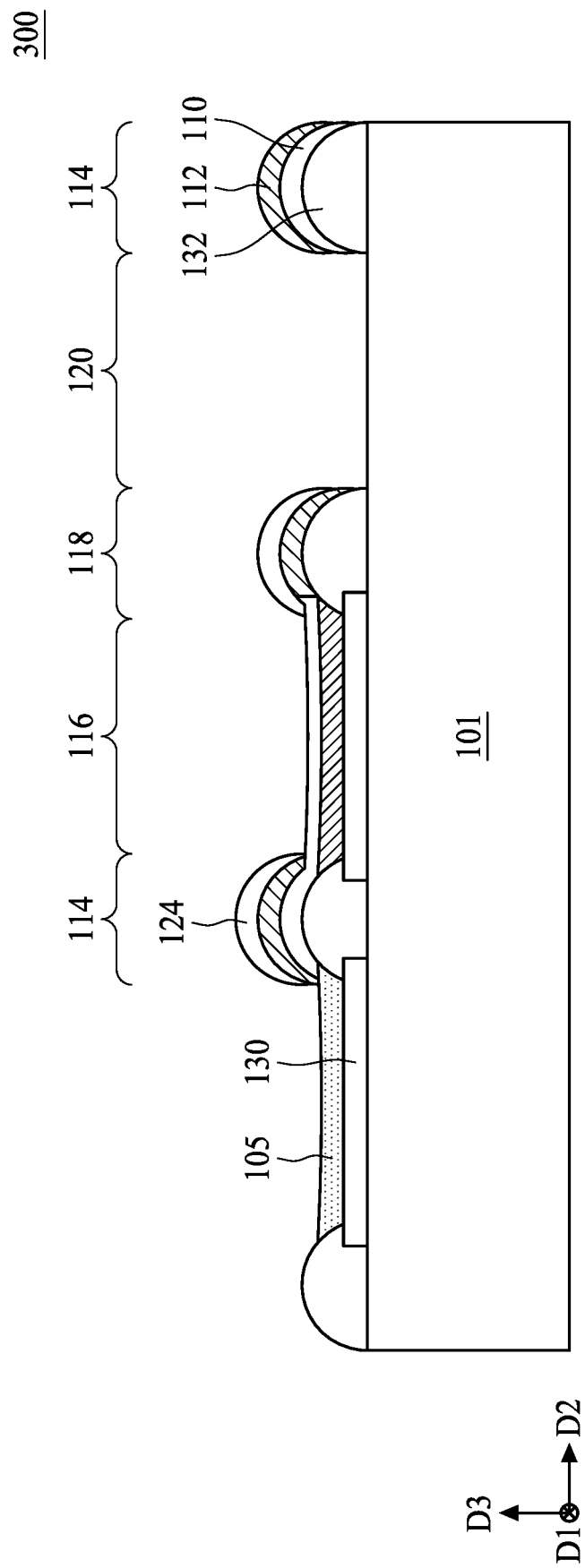
FIG. 7 is a cross-sectional view of an exemplary current-driven display according to another embodiment of the present disclosure.

In some embodiments, in a horizontal direction perpendicular to the third direction D3, the first non-overlapping area 116 is adjacent to the non-overlapping area 118 (as shown in FIG. 7). For example, the first non-overlapping area 116 and the non-overlapping area 118 are not overlap in the third direction D3, but they are connected in the horizontal direction.

In some embodiments, in a horizontal direction perpendicular to the third direction D3, the non-patterned area 120 is adjacent to the overlapping area 114. As shown in FIG. 4, the spacer 132 at the periphery of the non-patterned area 120 is covered by the first electrode layer 110 and the second electrode layer 112. In some embodiments, the non-patterned area 120 is adjacent to the first non-overlapping area 116. In some embodiments, the non-patterned area 120 is adjacent to the non-overlapping area 118. In some embodiments, the non-patterned area 120 is adjacent to at least one of the overlapping areas 114, the first non-overlapping area 116, and the non-overlapping area 118.

The above description and accompanying drawings are provided for illustrative purposes only, and the present disclosure is not limited thereto. Persons having ordinary skill in the art should understand that in a horizontal direction perpendicular to the third direction D3, the overlapping area 114, the first non-overlapping area 116, the second non-overlapping area 118, and the non-patterned area 120 can be arranged in any way.

Figure 5:
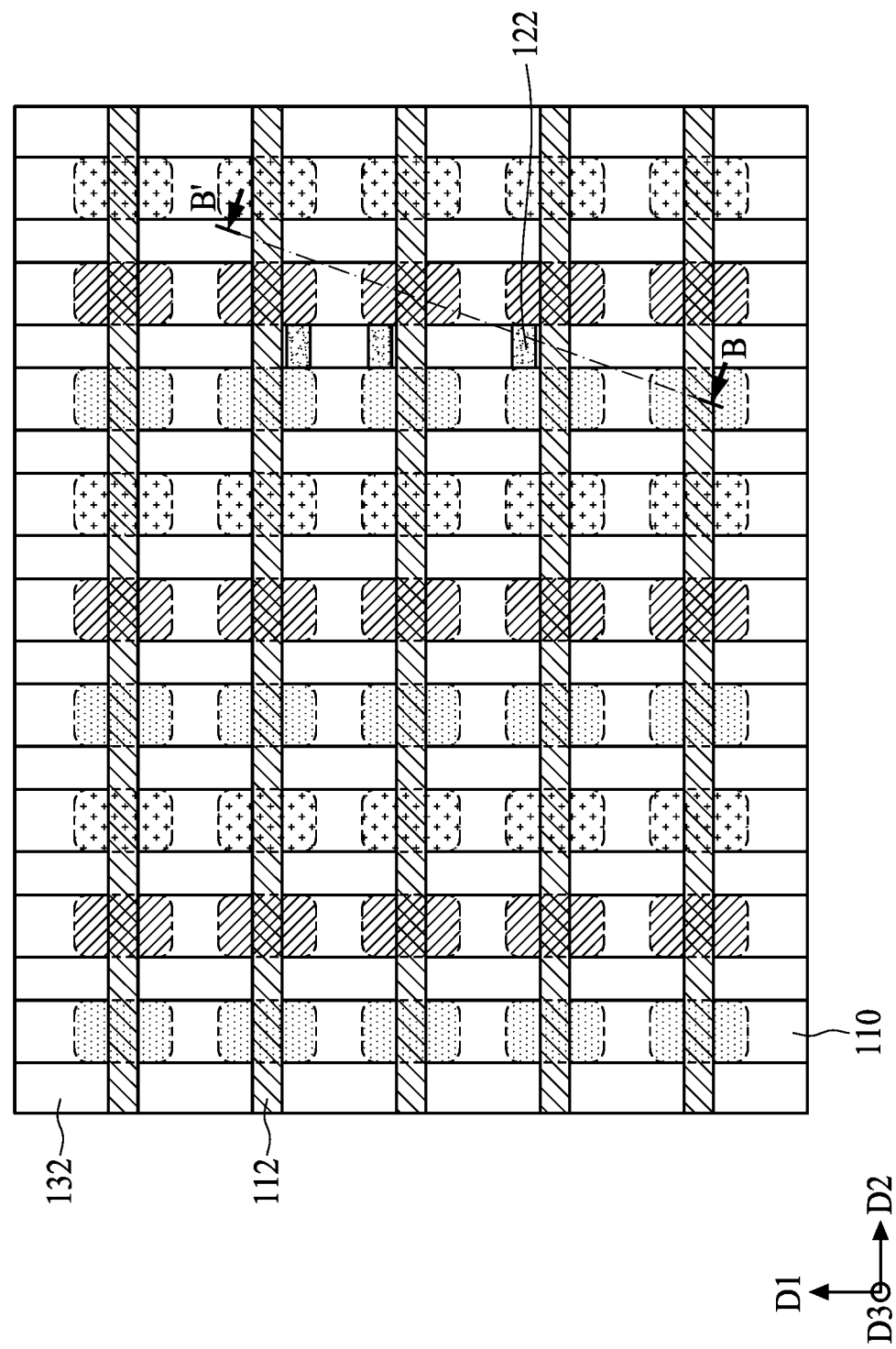
FIG. 5 is a top view of an exemplary current-driven display according to another embodiment of the present disclosure.

Referring to FIG. 5, which is a top view of an exemplary current-driven display 200 according to another embodiment of the present disclosure. The current-driven display 200 differs from the current-driven display 100 in that the current-driven display 200 further comprises a sensor 122. In some embodiments, the sensor 122 is disposed on the substrate 101 and is separated from the light-emitting units via the spacer 132. In some embodiments, the sensor 122 is in direct contact with the substrate 101.

In some embodiments, the sensor 122 does not overlap with the first electrode layer 110 or the second electrode layer 112 in the third direction D3. In some embodiments, the sensor 122 is located in the non-patterned area 120. In some embodiments, the sensor 122 may comprise a touch sensor, optical sensor, ultrasonic sensor, temperature sensor, or any other sensor that can be disposed on the substrate 101 and integrated with the current-driven display 100.

Figure 6:
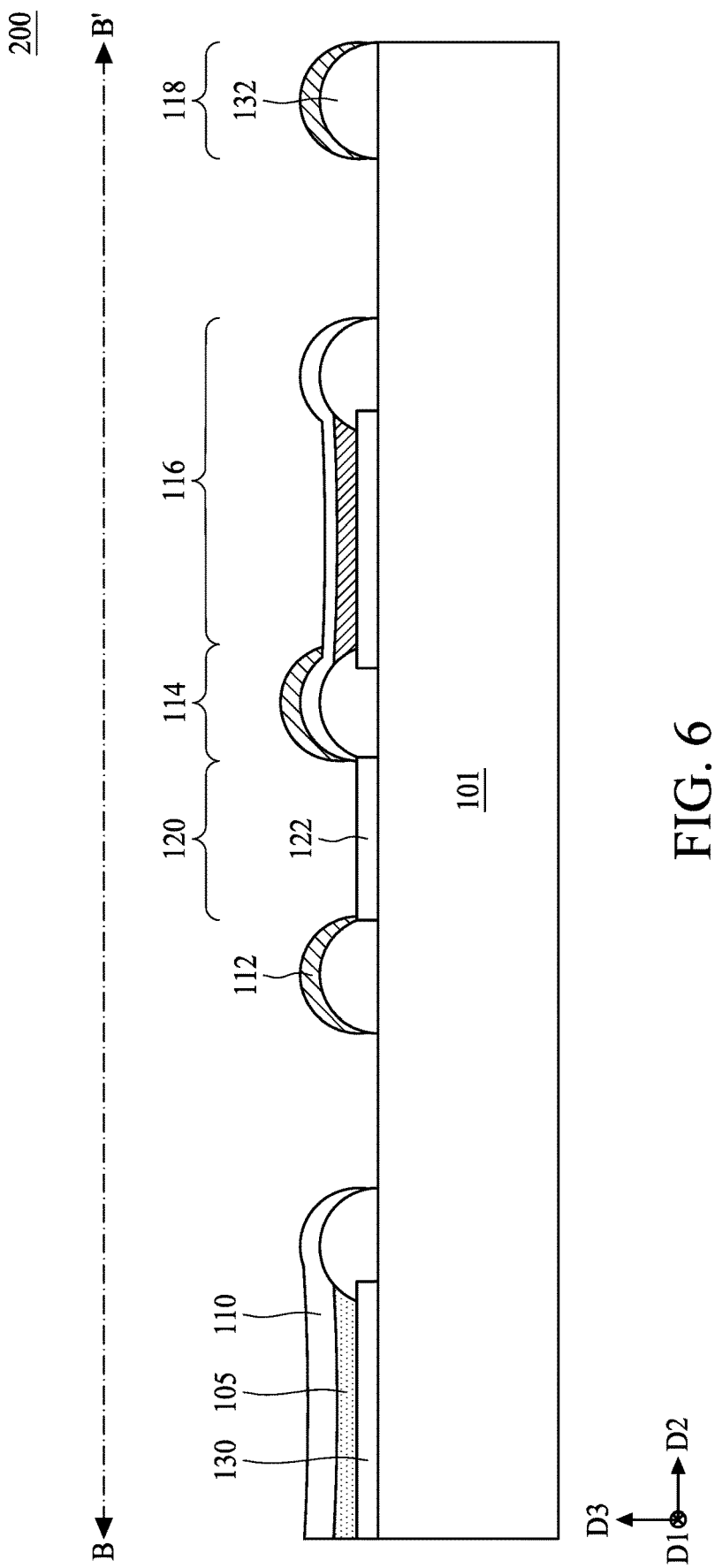
FIG. 6 is a cross-sectional view illustrating a portion taken along line BB' in FIG. 5.

Referring to FIG. 6, which is a cross-sectional view of the portion taken along line BB' in FIG. 5. In some embodiments, the sensor 122 is adjacent to the spacer 132. In some embodiments, the spacer 132 adjacent to the sensor 122 is in contact with the first non-overlapping area 116. In some embodiments, the spacer 132 adjacent to the sensor 122 is in contact with the non-overlapping area 118. In some embodiments, the periphery of the sensor 122 is not deposited with the first electrode layer 110 and the second electrode layer 112. In some embodiments, the sensor 122 may be disposed at a specific location on the substrate 101 depending on the function thereof.

Referring to FIG. 7, FIG. 7 is a cross-sectional view of an exemplary current-driven display according to another embodiment of the present disclosure 300. The current-driven display 300 further comprises third electrode layer 124. In some embodiments, the third electrode layer 124 and the first electrode layer 110 are equipotentially connected, directly or indirectly. In some embodiments, the third electrode layer 124 and the second electrode layer 112 are equipotentially connected, directly or indirectly. In some embodiments, the first electrode layer 110 and/or the second electrode layer 112 are connected via the third electrode layer 124, thereby connected to the power supply 140 and/or 142.

In some embodiments, the third electrode layer 124 is located in the second non-overlapping area 118. As shown in FIG. 7, the third electrode layer 124 is deposited on the second electrode layer 112 and therefore in direct contact with the second electrode layer 112. In some embodiments, the third electrode layer 124 is located in the first non-overlapping area 116; for example, the third electrode layer 124 is deposited on the first electrode layer 110 and therefore in direct contact with the first electrode layer 110. In some embodiments, the third electrode layer 124 is located in the overlapping area 114. For example, in some embodiments, in the overlapping area 114, the second electrode layer 112 is located between the third electrode layer 124 and the first electrode layer 110. Also, in some embodiments, the first electrode layer 110 is located between the third electrode layer 124 and the second electrode layer 112.

Figure 8:
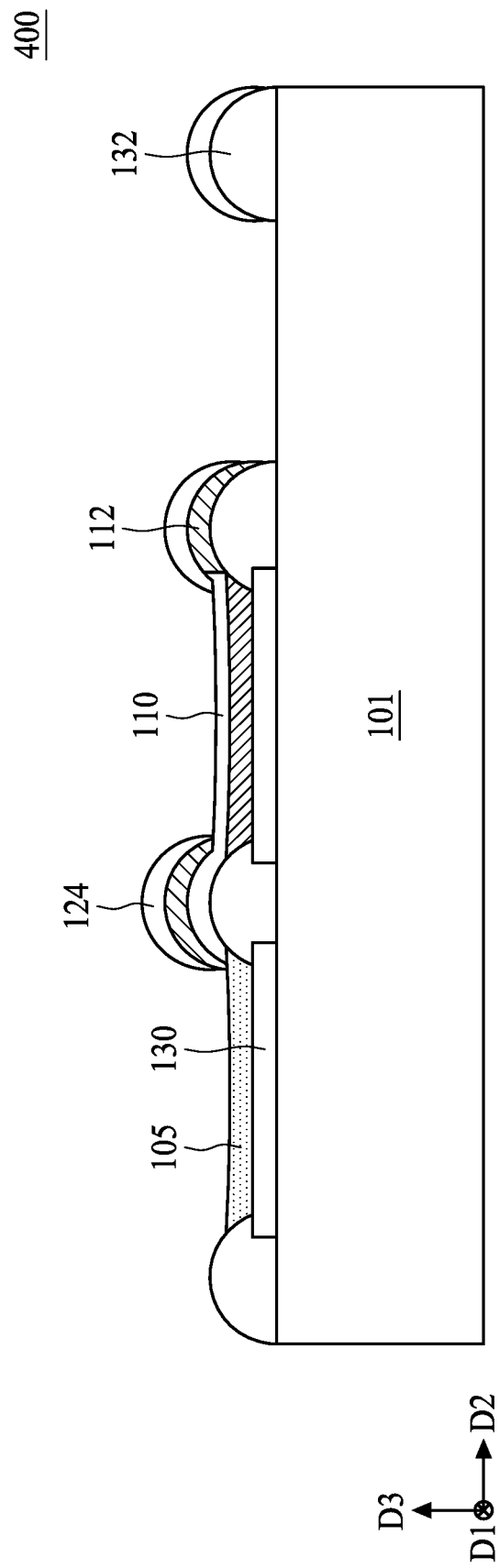
FIG. 8 is a cross-sectional view of an exemplary current-driven display according to another embodiment of the present disclosure.

Referring to FIG. 8, which is a cross-sectional view of an exemplary current-driven display 400 according to another embodiment of the present disclosure. In the current-driven display 400, the third electrode layer 124 partially contacts the spacer 132. In this embodiment, the third electrode layer 124 and the first electrode layer 110 may be formed during a single process step.

Figure 9:
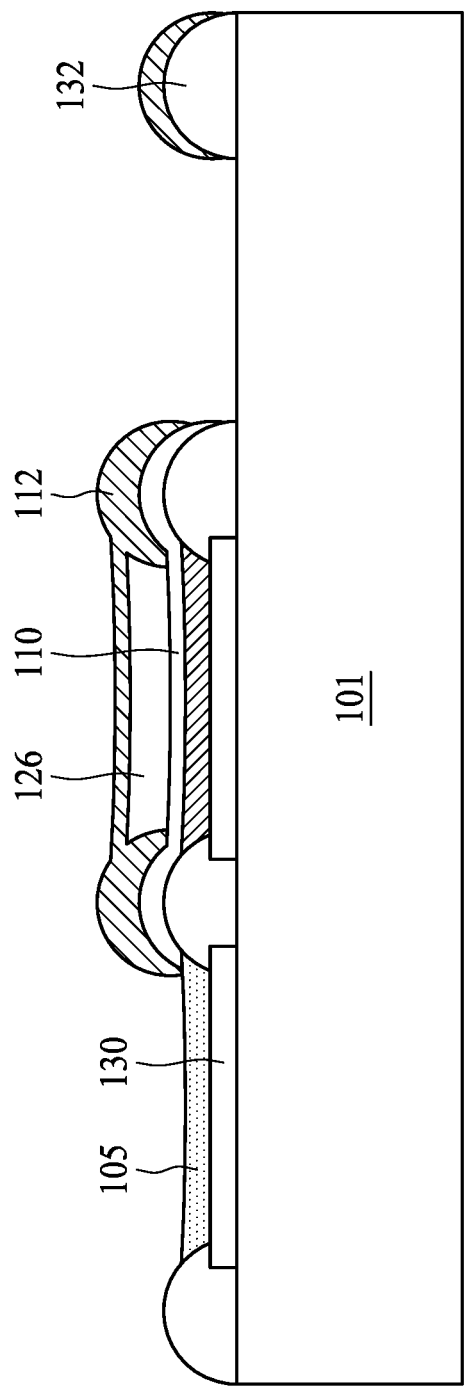
FIG. 9 is a cross-sectional view of an exemplary current-driven display according to another embodiment of the present disclosure.

Referring to FIG. 9, which is a cross-sectional view of an exemplary current-driven display 500 according to another embodiment of the present disclosure. In some embodiments, the current-driven display 500 further comprises an insulating material 126, located between the first electrode layer 110 and the second electrode layer 112. In some embodiments, a second electrode layer 112 equipotentially connects the discontinuous regions of the first electrode layer 110 across the insulating material 126. In some embodiments, the second electrode layer 112 encapsulates the insulating material 126.

In some embodiments, the insulating material 126 is located between any two of the first electrode layer 110, the second electrode layer 112, and the third electrode layer 124. In some embodiments, the insulating material 126 is encapsulated in the first electrode layer 110, the second electrode layer 112, and the third electrode layer 124.

Figure 10:
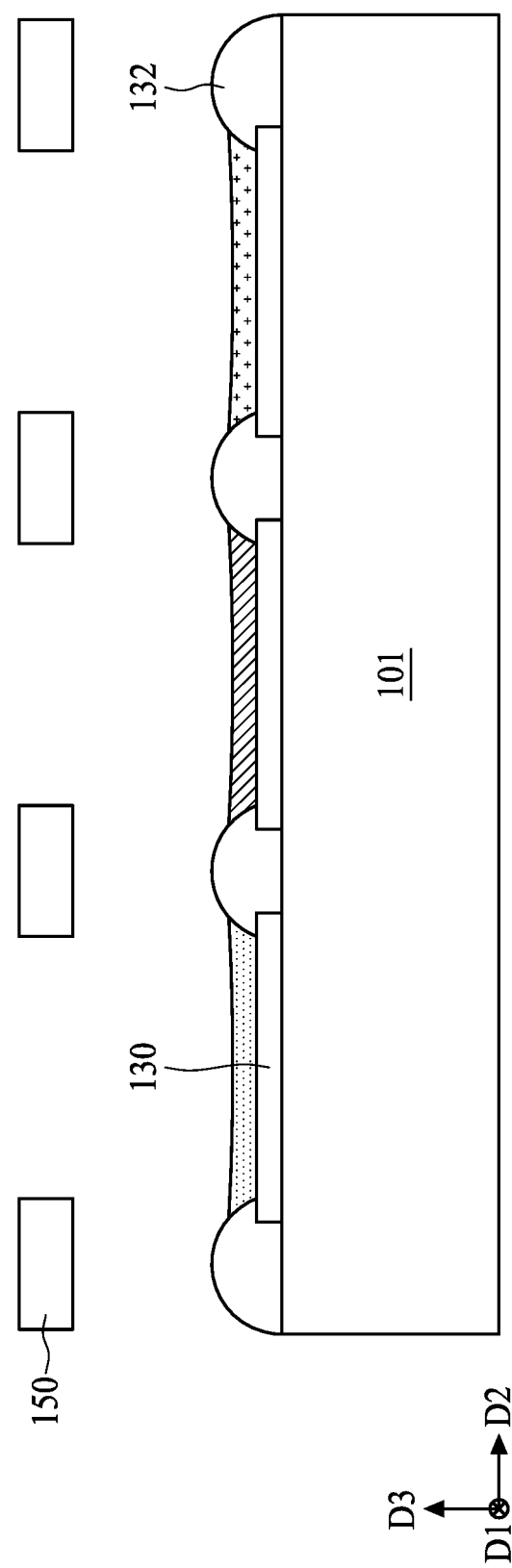
FIG. 10 is a cross-sectional view illustrating the steps of an exemplary method for producing a current-driven display according to one embodiment of the present disclosure.
Figure 11A:
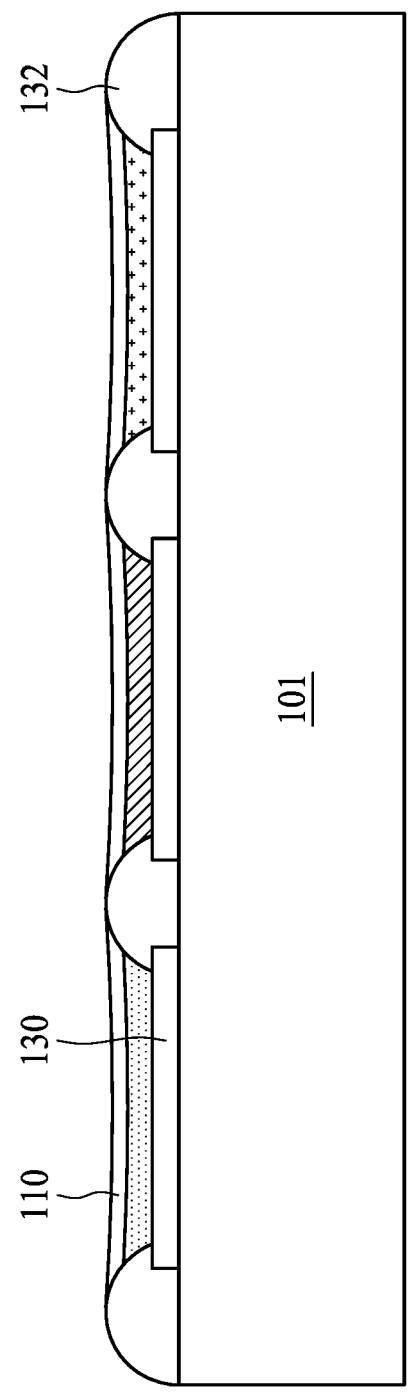
FIG. 11A is a cross-sectional view illustrating the steps of an exemplary method for producing a current-driven display according to one embodiment of the present disclosure.

Referring to FIG. 10, FIG. 11A to 11B, and FIG. 12A to 12B, which illustrate an exemplary method for producing the current-driven display 100 according to one embodiment of the present disclosure. As shown in FIG. 10, a mask 150 covers a portion of the substrate 101. In FIG. 11A, the material forming the first electrode layer 110 is deposited on the substrate 101 at locations that are not covered by the mask 150. In some embodiments, the mask 150 is disposed on the substrate 101 and is then removed using conventional methods for removing masks after forming the desired pattern of the first electrode layer 110.

Figure 11B:
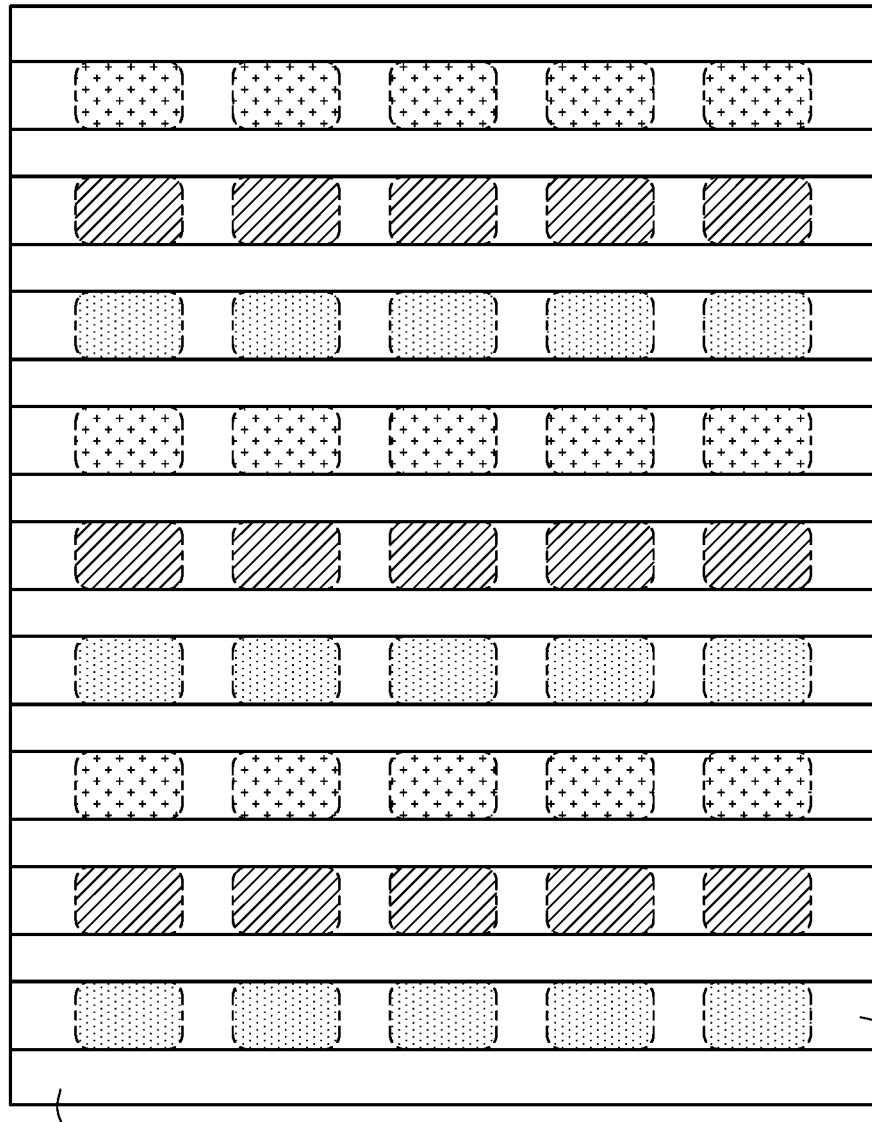
FIG. 11B is a top view illustrating the steps of an exemplary method for producing a current-driven display according to one embodiment of the present disclosure.

In some embodiments, after depositing the first electrode layer 110, the substrate 101 has several discontinuous regions in the second direction D2 thereon, as shown in FIG. 11B. However, the present disclosure is not limited thereto, and the method for producing the current-driven display 100 according to embodiments of the present disclosure is also applicable for depositing other types of the first electrode layer 110, such as the first electrode layers 110 shown in FIG. 2A to 2D.

Figure 12A:
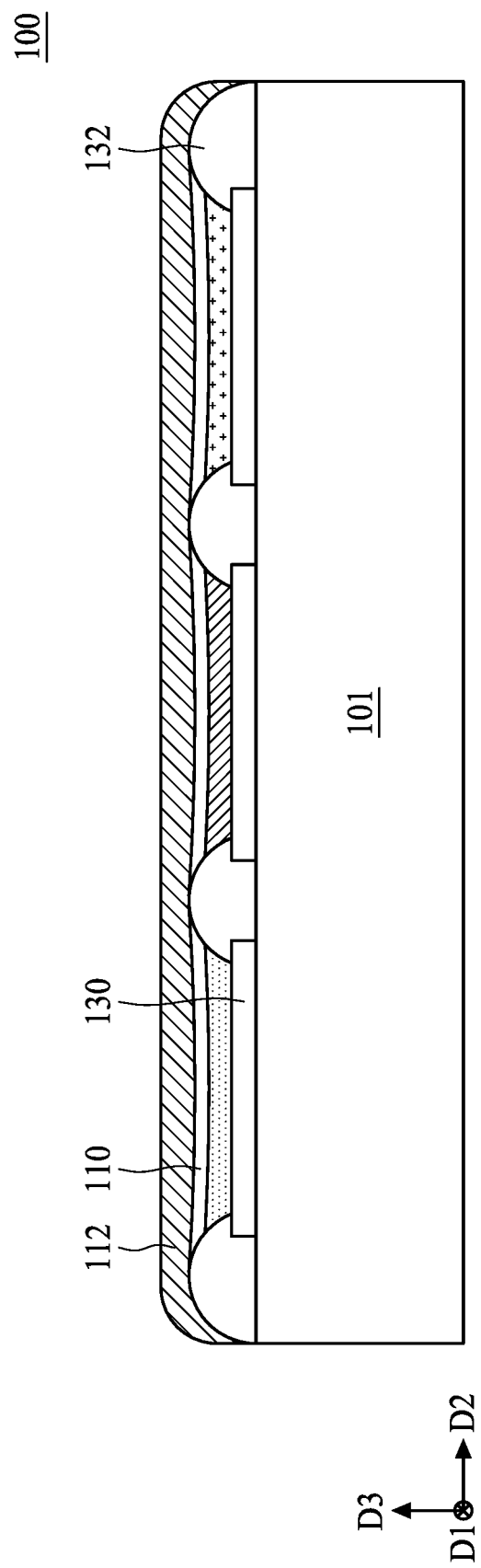
FIG. 12A is a cross-sectional view illustrating the steps of an exemplary method for producing a current-driven display according to one embodiment of the present disclosure.

Similar methods may be used to deposit the second electrode layer 112 on the substrate 101, as shown in FIG. 12A. The second electrode layer 112 equipotentially connects discontinuous regions.

Figure 12B:
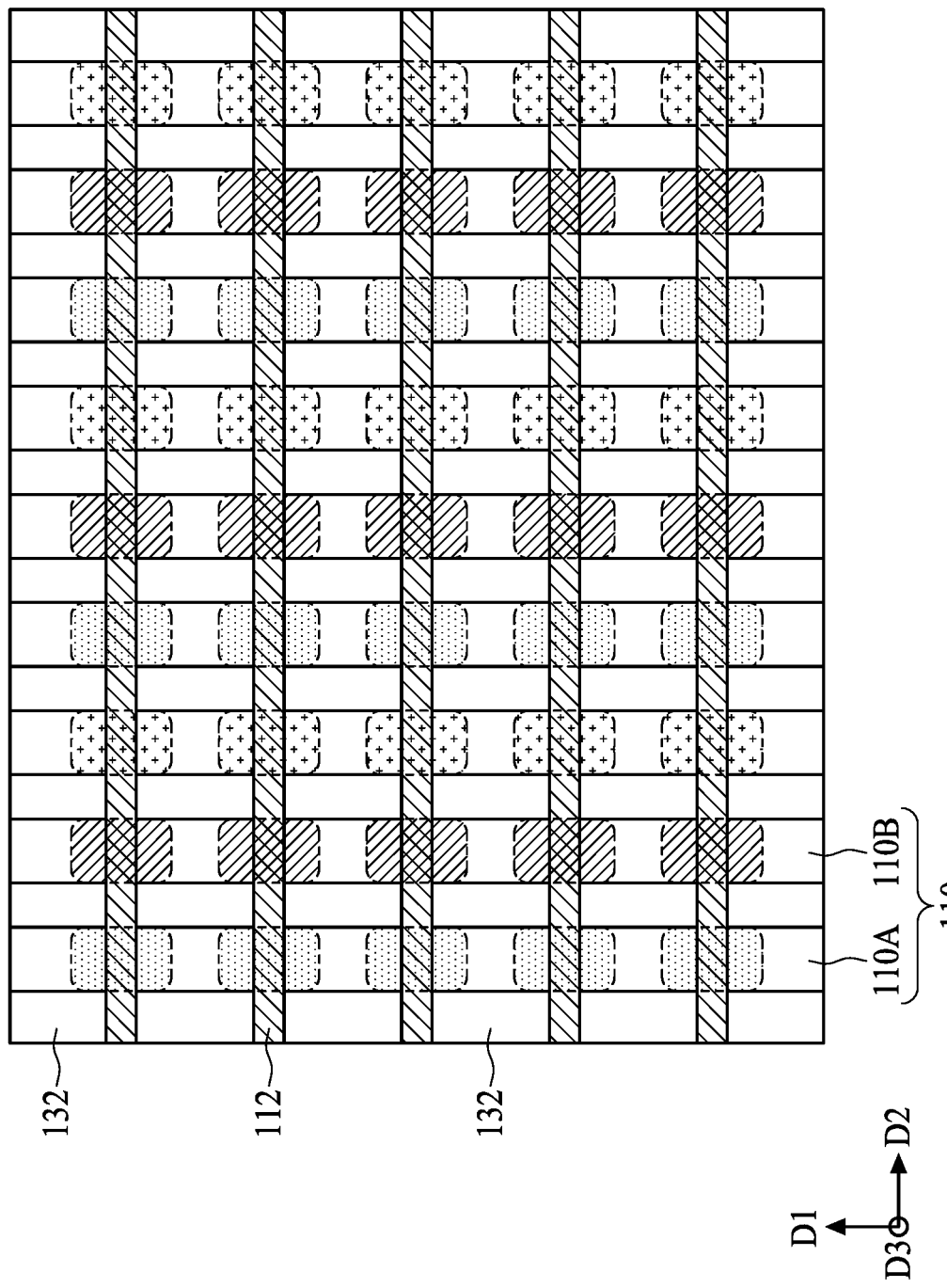
FIG. 12B is a top view illustrating the steps of an exemplary method for producing a current-driven display according to one embodiment of the present disclosure.

In some embodiments, it is feasible to design the size, covering area, covering locations of the mask 150, so that the first electrode layer 110 and the second electrode layer 112 are deposited on the substrate 101 as desired. As shown in FIG. 12B, a second electrode layer 112 is formed as a strip that is continuous in the second direction.

In some embodiments, mask 150, it is feasible to form the patterns as shown in FIGS. 4 to 9 on the substrate 101. In some embodiments, the first electrode layer 110 and the second electrode layer 112 are arranged to partially overlap, thereby forming an overlapping area. In some embodiments, the method further comprises forming a non-patterned area on the substrate. The non-patterned area is not covered by the plurality of light-emitting units, the spacer, the first electrode layer, and the second electrode layer. In one embodiment, the method further comprises arranging a sensor on the non-patterned area.

In some embodiments, it is feasible to use two or more different masks to carry out two or more patterning processes for electrodes. In some embodiments, it is feasible to further deposit a third electrode layer. In some embodiments, optimized effects may be achieved by respectively adjusting the size and thickness of the two electrode layers and modifying the characteristics of the current-driven display electrode, such as the conductivity, flexibility, reflective index, etc.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present invention. Accordingly, the appended claims are intended to include within their scope such processes, machines, manufacture, compositions of matter, means, methods and steps.

What is claimed is:

1. A current-driven display, comprising:
   a substrate, comprising a plurality of light-emitting units and a spacer separating each of the plurality of light-emitting units from one another;
   a first electrode layer, stacked on the substrate in a stacking direction, wherein the first electrode layer comprises a first region and a second region, wherein the first region and the second region contact one of the plurality of light-emitting units, respectively, and are separated by the spacer; and
   a second electrode layer, equipotentially connecting the first region and the second region across the spacer,
   wherein the first electrode layer comprises a first overlapping area and a first non-overlapping area, and the second electrode layer comprises a second overlapping area and a second non-overlapping area, the first overlapping area overlaps with the second overlapping area, the first non-overlapping area includes the first electrode layer and free from the second electrode layer, and the second non-overlapping area includes the second electrode layer and free from the first electrode layer.

2. The current-driven display of claim 1, wherein in a horizontal direction perpendicular to the stacking direction, the first non-overlapping area and the second non-overlapping area are connected.

3. The current-driven display of claim 1, wherein in a horizontal direction perpendicular to the stacking direction, the first overlapping area is at least adjacent to the first non-overlapping area or the second non-overlapping area.

4. The current-driven display of claim 1, wherein in a horizontal direction perpendicular to the stacking direction, the first non-overlapping area is adjacent to the second non-overlapping area.

5. The current-driven display of claim 1, wherein the substrate comprises a non-patterned area that is not covered by the plurality of light-emitting units, the spacer, the first electrode layer, and the second electrode layer.

6. The current-driven display of claim 5, wherein in a horizontal direction perpendicular to the stacking direction, the non-patterned area is adjacent to at least one of the first overlapping area, the first non-overlapping area and the second non-overlapping area.

7. The current-driven display of claim 5, further comprising a sensor, located in the non-patterned area.

8. The current-driven display of claim 1, further comprising a third electrode layer, at least equipotentially connected with the first electrode layer or the second electrode layer, directly or indirectly.

9. The current-driven display of claim 8, further comprising an insulating material, located between any two of the first electrode layer, the second electrode layer, and the third electrode layer.

10. The current-driven display of claim 8, wherein the third electrode layer partially contacts the spacer.

11. The current-driven display of claim 1, wherein the second electrode layer comprises a plurality of third regions; in a horizontal direction perpendicular to the stacking direction, the spacer is located between any two of the plurality of third regions.

12. The current-driven display of claim 11, wherein the first region and the second region are in a strip shape extending in a first direction and discontinuous in a second direction; wherein the plurality of third regions are in a strip shape extending in the second direction and discontinuous in the first direction; and wherein the first direction and the second direction are perpendicular to the stacking direction.

13. The current-driven display of claim 1, wherein at least one of the first electrode layer and the second electrode layer is a composite structure made of two or more materials.

14. The current-driven display of claim 1, further comprising a lower electrode, located between the first electrode layer and the substrate or between the substrate and the second electrode layer.

15. The current-driven display of claim 14, wherein the spacer covers a periphery of the lower electrode.

16. The current-driven display of claim 1, wherein the first electrode layer partially contacts the spacer.

17. A method for producing a current-driven display, comprising:
   providing a substrate, wherein the substrate comprises a plurality of light-emitting units and a spacer separating each of the plurality of light-emitting units from one another;
   depositing a first electrode layer on the substrate in a stacking direction, wherein the first electrode layer comprises a first region and a second region, wherein the first region and the second region contact one of the plurality of light-emitting units, respectively, and are separated by the spacer;
   depositing a second electrode layer on the substrate in the stacking direction, wherein the second electrode layer equipotentially connects the first region and the second region across the spacer; and
   partially covering the first electrode layer with the second electrode layer to form an overlapping area;
   wherein the first electrode layer covers the overlapping area and a first non-overlapping area, and the second electrode layer covers the overlapping area and a second non-overlapping area, the first non-overlapping area is free from the second electrode layer, and the second non-overlapping area is free from the first electrode layer.

18. The method for producing the current-driven display of claim 17, further comprising:
   disposing an insulating material between the first electrode layer and the second electrode layer.

19. The method for producing the current-driven display of claim 17, further comprising:
   forming a non-patterned area on the substrate, wherein the non-patterned area is not covered by the plurality of light-emitting units, the spacer, the first electrode layer, and the second electrode layer.

20. The method for producing the current-driven display of claim 19, further comprising:
   arranging a sensor on the non-patterned area.

* * * * *